United States Patent
Ohno et al.

(10) Patent No.: US 10,804,457 B2
(45) Date of Patent: *Oct. 13, 2020

(54) MAGNETORESISTIVE ELEMENT AND MAGNETIC MEMORY

(71) Applicant: TOHOKU UNIVERSITY, Sendai-shi, Miyagi (JP)

(72) Inventors: Hideo Ohno, Sendai (JP); Shoji Ikeda, Sendai (JP); Fumihiro Matsukura, Sendai (JP); Masaki Endoh, Sendai (JP); Shun Kanai, Sendai (JP); Katsuya Miura, Higashimurayama (JP); Hiroyuki Yamamoto, Shiki (JP)

(73) Assignee: TOHOKU UNIVERSITY, Sendai-Shi, Miyagi (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/252,128

(22) Filed: Aug. 30, 2016

(65) Prior Publication Data

US 2017/0025600 A1    Jan. 26, 2017

Related U.S. Application Data

(63) Continuation of application No. 13/578,866, filed as application No. PCT/JP2011/052999 on Feb. 14, 2011, now Pat. No. 9,450,177.

(30) Foreign Application Priority Data

Mar. 10, 2010    (JP) .................................. 2010-053226

(51) Int. Cl.
*G11C 11/16*    (2006.01)
*H01L 43/08*    (2006.01)
(Continued)

(52) U.S. Cl.
CPC ............ *H01L 43/08* (2013.01); *G11C 11/161* (2013.01); *H01L 43/10* (2013.01); *H01L 27/228* (2013.01); *H01L 43/12* (2013.01)

(58) Field of Classification Search
CPC .............................. G11C 11/16; G11C 11/161
(Continued)

(56) References Cited

U.S. PATENT DOCUMENTS

| RE28,500 E | 7/1975 | Bresee et al. |
| 5,093,753 A * | 3/1992 | Friederich ............. H01L 43/065 |
| | | 257/E43.003 |

(Continued)

FOREIGN PATENT DOCUMENTS

| JP | 2004-253739 A | 9/2004 |
| JP | 2005-116923 A | 4/2005 |

(Continued)

OTHER PUBLICATIONS

Endo et al. "Electric-Field Effects on Thickness Dependent Magnetic Anisotropy of Sputtered MgO/Co$_{40}$Fe$_{40}$B$_{20}$/Ta Structures" *Applied Physics Letters*, vol. 96, (2010), 212503.

(Continued)

*Primary Examiner* — Jay W. Radke
(74) *Attorney, Agent, or Firm* — Rabin & Berdo, P.C.

(57) ABSTRACT

A magnetoresistive element includes a reference layer having a fixed magnetization direction and including a ferromagnetic material containing Fe or Co, a recording layer having a variable magnetization direction and including a ferromagnetic material, and one non-magnetic layer that is formed between the reference layer and the recording layer and that contains oxygen. One of the reference layer and the recording layer contains Fe. The three layers are arranged so that a magnetization direction of the one of the reference layer and the recording layer becomes perpendicular to a (Continued)

layer surface by an interfacial perpendicular magnetic anisotropy at an interface between the one of the reference layer and the recording layer and the one non-magnetic layer resulting from the one of the reference layer and the recording layer having a predetermined thickness. The one of the reference layer and the recording layer has a bcc structure.

20 Claims, 7 Drawing Sheets

(51) Int. Cl.
　　　H01L 43/10　　　(2006.01)
　　　H01L 27/22　　　(2006.01)
　　　H01L 43/12　　　(2006.01)
(58) Field of Classification Search
　　　USPC .................................. 365/158, 171, 158.171
　　　See application file for complete search history.

(56) References Cited

U.S. PATENT DOCUMENTS

| | | | |
|---|---|---|---|
| 5,374,472 A * | 12/1994 | Krishnan | B82Y 25/00 117/105 |
| 7,538,402 B2 | 5/2009 | Fukumoto | |
| 8,072,800 B2 | 12/2011 | Chen et al. | |
| 8,120,127 B2 | 2/2012 | Nagahara et al. | |
| 8,154,913 B2 | 4/2012 | Fukami et al. | |
| 8,247,093 B2 | 8/2012 | Rodmacq et al. | |
| 8,374,025 B1 | 2/2013 | Ranjan et al. | |
| 8,565,013 B2 | 10/2013 | Bessho et al. | |
| 8,593,862 B2 | 11/2013 | Ranjan et al. | |
| 8,625,342 B2 | 1/2014 | Higo et al. | |
| 8,917,541 B2 | 12/2014 | Ohno et al. | |
| 9,450,177 B2 * | 9/2016 | Ohno | H01L 43/08 |
| 2003/0012050 A1 * | 1/2003 | Iwasaki | B82Y 25/00 365/171 |
| 2004/0001372 A1 | 1/2004 | Higo et al. | |
| 2005/0104101 A1 | 5/2005 | Sun et al. | |
| 2005/0117392 A1 | 6/2005 | Hayakawa et al. | |
| 2005/0185455 A1 * | 8/2005 | Huai | B82Y 25/00 365/171 |
| 2006/0023497 A1 | 2/2006 | Kawazoe et al. | |
| 2006/0104110 A1 * | 5/2006 | Sun | G11C 11/16 365/173 |
| 2006/0262594 A1 | 11/2006 | Fukumoto | |
| 2007/0086121 A1 | 4/2007 | Nagase et al. | |
| 2007/0228501 A1 | 10/2007 | Nakamura et al. | |
| 2008/0031035 A1 | 2/2008 | Rodmacq et al. | |
| 2008/0088980 A1 * | 4/2008 | Kitagawa | B82Y 25/00 360/313 |
| 2008/0089118 A1 | 4/2008 | Kajiyama | |
| 2008/0151615 A1 * | 6/2008 | Rodmacq | B82Y 25/00 365/173 |
| 2008/0171233 A1 * | 7/2008 | Schatz | B82Y 10/00 428/819.1 |
| 2008/0253174 A1 | 10/2008 | Yoshikawa et al. | |
| 2009/0080239 A1 * | 3/2009 | Nagase | H01L 27/228 365/158 |
| 2009/0091863 A1 | 4/2009 | Hosotani et al. | |
| 2009/0207724 A1 | 8/2009 | Yanagi et al. | |
| 2009/0323404 A1 | 12/2009 | Jung et al. | |
| 2010/0118600 A1 | 5/2010 | Nagase et al. | |
| 2010/0188893 A1 | 7/2010 | Zhou | |
| 2010/0233515 A1 | 9/2010 | Kong et al. | |
| 2011/0049659 A1 | 3/2011 | Suzuki et al. | |
| 2011/0063899 A1 | 3/2011 | Ogimoto | |
| 2011/0064969 A1 | 3/2011 | Chen et al. | |
| 2011/0170339 A1 * | 7/2011 | Wunderlich | G11C 11/16 365/158 |
| 2012/0012953 A1 | 1/2012 | Lottis et al. | |
| 2012/0018822 A1 | 1/2012 | Gaudin et al. | |
| 2012/0020152 A1 | 1/2012 | Gaudin et al. | |
| 2012/0043631 A1 | 2/2012 | Ohmori et al. | |
| 2012/0063221 A1 | 3/2012 | Yamane et al. | |
| 2012/0205758 A1 * | 8/2012 | Jan | H01L 29/66984 257/421 |
| 2012/0261777 A1 | 10/2012 | Shukh | |
| 2012/0280336 A1 | 11/2012 | Jan et al. | |
| 2013/0028013 A1 | 1/2013 | Ikeda et al. | |
| 2013/0032910 A1 | 2/2013 | Jung et al. | |
| 2013/0141966 A1 | 6/2013 | Ohno et al. | |
| 2013/0270661 A1 | 10/2013 | Yi et al. | |
| 2013/0288398 A1 * | 10/2013 | Yamamoto | H01L 43/08 438/3 |
| 2014/0340961 A1 | 11/2014 | Ohno et al. | |

FOREIGN PATENT DOCUMENTS

| | | |
|---|---|---|
| JP | 2007-142364 A | 6/2007 |
| JP | 2007-157840 A | 6/2007 |
| JP | 2007-266498 A | 10/2007 |
| JP | 2008-098515 A | 4/2008 |
| JP | 2009-081315 A | 4/2009 |
| JP | 2009-094104 A | 4/2009 |
| JP | 2011-155073 A | 8/2011 |
| JP | 2011-258596 A | 12/2011 |
| JP | 2012-064625 A | 3/2012 |
| JP | 2012-235015 A | 11/2012 |
| WO | WO-2009/093387 A1 | 7/2009 |
| WO | WO-2009/098796 A1 | 8/2009 |
| WO | WO-2009/133650 A1 | 11/2009 |

OTHER PUBLICATIONS

Ikeda et al., "A Perpendicular-Anisotropy CoFeB—MgO Magnetic Tunnel Junction" *Nature Materials*, vol. 9, (Sep. 2010), pp. 721-724, published online Jul. 11, 2010.

Yamanouchi et al., "Dependence of Magnetic Anisotropy on MgO Thickness and Buffer Layer in $Co_{20}Fe_{60}B_{20}$—MgO Structure" *Journal of Applied Physics*, vol. 109, (2011), pp. 07C712-1 to 07C712-3.

Worledge et al., "Spin Torque Switching of Perpendicular Ta | CoFeB | MgO-based Magnetic Tunnel Junctions" *Applied Physics Letters*, vol. 98, (2011), pp. 022501-1 to 022501-3.

Parkin, "Systematic Variation of the Strength and Oscillation Period of Indirect Magnetic Exchange Coupling through the 3d, 4d, and 5d Transition Metals," *Physical Review Letter*, vol. 67, No. 25, (1991), pp. 3598-3601.

Yang et al., "First-principles Investigation of the Very Large Perpendicular Magnatic Anisotropy at Fe | MgO and Co | MgO Interfaces" *Physical Review B*, vol. 84, (2011), pp. 054401-1 to 054401-5.

Abraham et al., "Investigation of Perpendicular Interface Magnetic Anisotropy in CoFeB Films Using Seed and Insertion Layers" *The 56th Magnetism and Magnetic Materials Conference*, (2011).

International Search Report with English translation dated Apr. 26, 2011 (four (4) sheets).

Form PCT/ISA/237 (three (3) sheets).

Mangin et al., "Current-Induced Magnetization Reversal in Nanopillars with Perpendicular Anisotropy", Nature Materials, vol. 5, Mar. 2006, pp. 210-215 (six (6) sheets).

Japanese Office Action with partial English translation dated Sep. 24, 2013 (six (6) pages).

H. Sukegawa et al., "Significant Magnetoresistance Enhancement Due to a Cotunneling Process in a Double Tunnel Junction with Single Discontinuous Ferromagnetic Layer Insertion", Feb. 18, 2005, pp. 068304-1-068304-4, Physical Review Letters.

T. Miyazaki et al., "Spintronics: Foundation of MRAM Memory for Next Generation," 2007, pp. 96 and 97, Nikkan Kogyo Shimbun.

Japanese Office Action dated Nov. 11, 2014, with English translation (six (6) pages).

Japanese Office Action dated Mar. 3, 2015, with English translation (four (4) pages).

Sebastian van Dijken et al., "Correlation between perpendicular exchange bias and magnetic anisotropy in IrMn/[Co/Pt]n and [Pt/Co]n/IrMn multilayers", Journal of Applied Physics, 97, 063907 (2005).

(56) References Cited

OTHER PUBLICATIONS

Sebastian van Diken et al., "IrMn as exchange-biasing material in systems with perpendicular magnetic anisotropy", Journal of Applied Physics 97, 10k114 (2005).
R. Lavrijsen et al., "Tuning the interlayer exchange coupling between single perpendicularly magnetized CoFeB layers", Applied Physics Letters 100, 052411 (2012).
Xu Zhang et al., "Large Perpendicular Exchange Bias in CoFeB/MgO Systems Pinned by a Bottom IrMn Layer via an interfacial CoFe/Ta Composite Layer", IEEE Transactions on Magnetics, vol. 51, No. 11, Nov. 2015.

* cited by examiner

MAGNETORESISTIVE ELEMENT AND MAGNETIC MEMORY

CROSS-REFERENCE TO RELATED APPLICATIONS

This is a continuation application of U.S. patent application Ser. No. 13/578,866, filed on Aug. 14, 2012, and allowed on May 20, 2016, which was a National Stage application of PCT/JP2011/052999, filed on Feb. 14, 2011. Further, this patent application also claims the benefit of priority of Japanese Patent Application No. 2010-053226, filed on Mar. 10, 2010. The entire contents of these prior applications are hereby incorporated by reference.

BACKGROUND OF THE INVENTION

Technical Field

The present invention relates to a magnetoresistive element, and to magnetic memory comprising such a magnetoresistive element as a memory cell.

Background Art

Figure 1:
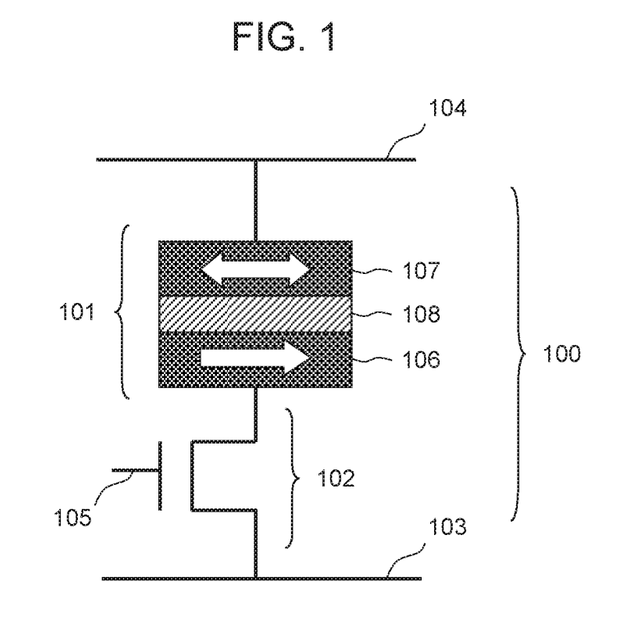
FIG. 1 is a schematic view showing a basic structure of a memory cell of magnetic memory.

As shown in FIG. 1, a memory cell 100 of magnetic random access memory (MRAM) has a structure where a magnetoresistive element 101 and a select transistor 102 are electrically connected in series. The source electrode, drain electrode, and gate electrode of the select transistor 102 are electrically connected with a source line 103, with a bit line 104 via the magnetoresistive element 101, and with a word line 105, respectively. The basic structure of the magnetoresistive element 101 is a three-layer structure in which a non-magnetic layer 108 is sandwiched by two ferromagnetic layers, namely a first ferromagnetic layer 106 and a second ferromagnetic layer 107. In the illustrated example, the first ferromagnetic layer 106 has a fixed magnetization direction and serves as a reference layer. The second ferromagnetic layer 107 has a variable magnetization direction and serves as a recording layer. This magnetoresistive element 101 has a low resistance when the magnetization direction of the first ferromagnetic layer 106 and the magnetization direction of the second ferromagnetic layer 107 are mutually parallel (P state), and a high resistance when they are anti-parallel (AP state). With MRAM, this change in resistance is made to correspond to bit information of "0" and "1". Bit information is written through spin-transfer torque magnetization switching caused by the current flowing through the magnetoresistive element 101. When a current flows from the reference layer to the recording layer, the magnetization of the recording layer becomes anti-parallel to the magnetization of the reference layer, and the bit information becomes "1". When a current flows from the recording layer to the reference layer, the magnetization of the recording layer becomes parallel to the magnetization of the reference layer, and the bit information becomes "0". Since the speed of magnetization switching by current is approximately 1 nanosecond, MRAM can be written to at an extremely high speed. In addition, since bit information is recorded by way of the magnetization direction of the recording layer, MRAM is non-volatile, and is able to keep standby power consumption low. Accordingly, there are high expectations for MRAM as a next-generation memory.

In addition, although the case illustrated in FIG. 1 is one where the first ferromagnetic layer 106 of the magnetoresistive element 101 is a reference layer, and the second ferromagnetic layer 107 a recording layer, it would still similarly operate as MRAM even if the first ferromagnetic layer 106 of the magnetoresistive element 101 were made to be a recording layer with a variable magnetization direction, and the second ferromagnetic layer 107 a reference layer with a fixed magnetization direction. In this case, too, when a current flows from the reference layer to the recording layer, the magnetization of the recording layer becomes anti-parallel to the magnetization of the reference layer, and the bit information becomes "1". When a current flows from the recording layer to the reference layer, the magnetization of the recording layer becomes parallel to the magnetization of the reference layer, and the bit information becomes "0".

PRIOR ART DOCUMENT

Non-Patent Document

[Non-Patent Document 1] S. MANGIN, D. RAVELOSONA, J. A. KATINE, M. J. CAREY, B. D. TERRIS and ERIC E. FULLERTON, "Current-induced magnetization reversal in nanopillars with perpendicular anisotropy", Nature Mater. 5, 210 (2006).

SUMMARY OF THE INVENTION

There are obstacles to realizing MRAM, chief examples thereof being the conditions that three characteristics of the magnetoresistive element as a recording element must satisfy, namely, magnetoresistance ratio (MR ratio), switching current density, and thermal stability factor. These conditions vary depending on the density, feature size, operation speed, etc., of the MRAM. By way of example, the higher the read speed is, the higher the required magnetoresistance ratio value becomes. Typically, a high magnetoresistance ratio of 70% to upwards of 100% is required. In addition, to increase write speed and reduce power consumption, a switching current density of $2 \times 10^6$ A/cm$^2$ or less is required. Further, for a retention time of 10 years or longer and to prevent write errors, a thermal stability factor of 80 or greater is required.

There is known a configuration where a material containing a 3d transition metal element is used for the first ferromagnetic layer 106 and the second ferromagnetic layer 107, and MgO for a first non-magnetic layer, to achieve a high magnetoresistance ratio. In this case, it is preferable that the material containing a 3d transition metal element have a bcc structure. This is because when the material containing a 3d transition metal element is of a bcc structure, it has an advantage in that it achieves coherent conduction with MgO, as a result of which the magnetoresistance ratio tends to be high. In this case, the magnetization directions of the first ferromagnetic layer 106 and the second ferromagnetic layer 107 become parallel to the film surface as in FIG. 1. On the other hand, when a multi layer film of Co and Pt, Ni and Pt, etc., or a perpendicular magnetic anisotropy material, chief examples of which are such alloys as FePt, TbTeCo, etc., is used for the first ferromagnetic layer 106 and the second ferromagnetic layer 107 as in Non-Patent Literature 1, it is said that a low switching current density and a high thermal stability factor can be achieved. This is due to the fact that the magnetization directions of the first ferromagnetic layer 106 and the second ferromagnetic layer 107 become perpendicular to the film surface. However, in the case of a combination of such perpendicular magnetic anisotropy materials and MgO, the magnetoresistance ratio becomes small. For this reason, the current situation is such that methods in which a material containing a 3d transition metal element of a bcc structure and whose magnetization is parallel to the film surface is inserted between MgO and a perpendicular magnetic anisotropy material, thereby increasing the MR ratio, and so forth, are being tried. However, with such methods, the structure becomes complex, and problems remain such as controlling the magnetization direction of the material containing a 3d transition metal element, the fact that the magnetoresistance ratio does not become as high as anticipated, etc.

In order to solve the problems discussed above, the material used for at least one of the first ferromagnetic layer 106 and second ferromagnetic layer 107 forming the magnetoresistive element in FIG. 1 is made to comprise a ferromagnetic layer with a small damping constant, such as a material containing at least one type of 3d transition metal, e.g., Co, Fe, etc., or a Heusler alloy, chief examples of which include $Co_2MnSi$, etc., thereby controlling the magnetoresistance ratio. Ordinarily, when a magnetoresistive element is fabricated with a material containing at least one type of 3d transition metal, e.g., Co, Fe, etc., and which becomes a bcc structure, the magnetization directions of the ferromagnetic layers become parallel to the film surface. However, the present inventors have developed a technique that achieves a low switching current density and a high thermal stability factor by controlling the thicknesses of the ferromagnetic layers at the atomic layer level and making their magnetization directions perpendicular to the film surface.

Figure 2:
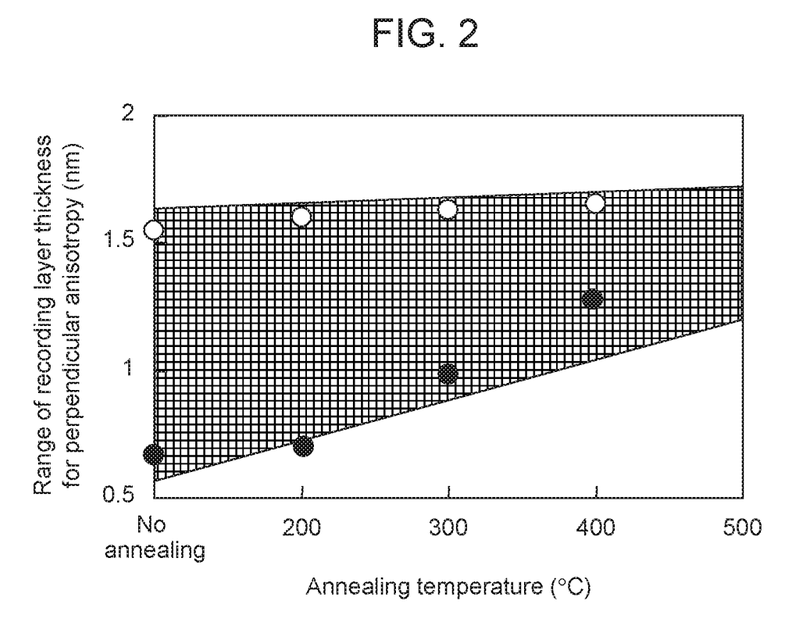
FIG. 2 is a diagram showing, with respect to annealing temperature, changes in the thickness required for the magnetization direction of a magnetoresistive element to become perpendicular to the film surface for a case where CoFeB is used for a first ferromagnetic layer and a second ferromagnetic layer.

With regard to an example in which CoFeB is used for the ferromagnetic layers, FIG. 2 shows, with respect to the temperature of the annealing step included in the fabrication process, the thickness that was required for the magnetization direction to become perpendicular to the film surface. In this example, annealing was performed over a period of one hour. The white circles and black circles in the chart represent the upper and lower limits of thickness, respectively. As can be seen in the chart, the thickness range of CoFeB for which the magnetization direction becomes perpendicular to the film surface varies with respect to annealing temperature.

The example of FIG. 2 is for the CoFeB, and the relationship between the film thickness necessary for the magnetization direction to be perpendicular to the layer surface and the annealing temperature may differ from FIG. 2 when the material contains at least one type of other 3d transition metal. However, the magnetization direction can be changed from parallel to perpendicular with respect to the layer surface by suitably controlling the film thickness of the material. The inventors found the cause of the magnetization direction becoming perpendicular to the layer surface to be a specific change in anisotropy at the interface of the CoFeB. By forming a thin film by controlling the film thickness of the CoFeB on an atomic layer level, the ratio of volume in which the interfacial effect is present relative to the volume of the CoFeB layer can be increased. Thus, the effect of specific anisotropy at the interface becomes significant such that the magnetization direction becomes perpendicular to the layer surface. The effect is particularly increased at the interface between an oxygen-containing compound represented by MgO, $Al_2O_3$, $SiO_2$, or the like, and a ferromagnetic material containing at least one type of 3d transition metal, such as Co and Fe, whereby the magnetization becomes oriented more easily in the direction perpendicular to the layer surface.

Figure 3:
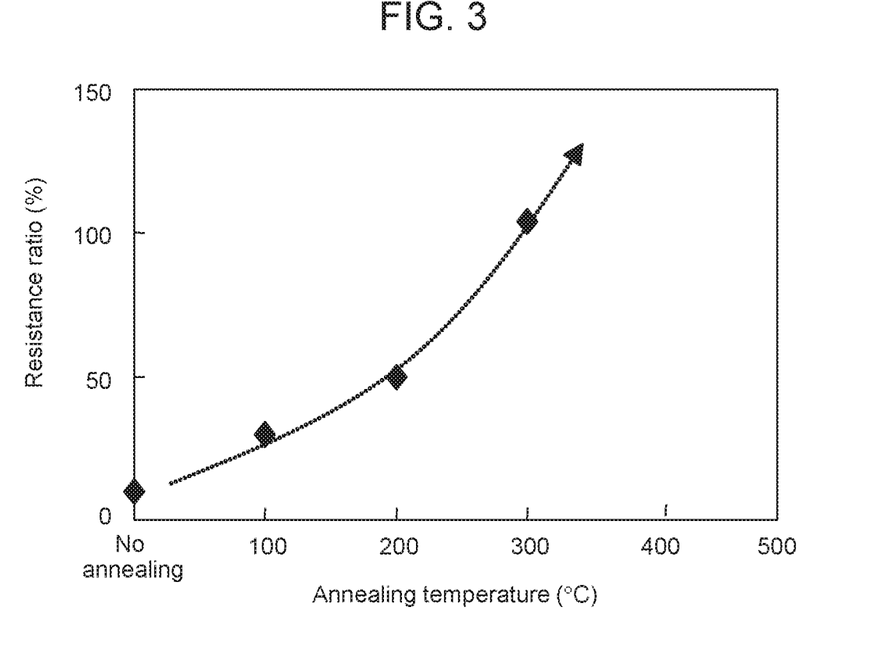
FIG. 3 is a diagram showing changes in the magnetoresistance ratio of a magnetoresistive element with respect to annealing temperature for a case where CoFeB is used for a first ferromagnetic layer and a second ferromagnetic layer.

On the other hand, FIG. 3 shows, with respect to annealing temperature, the magnetoresistance ratio of a magnetoresistive element in a case where, by way of example, CoFeB is used for the first ferromagnetic layer 106 and the second ferromagnetic layer 107. As the annealing temperature rises, the magnetoresistance ratio increases. Accordingly, in this example, in order to obtain a magnetoresistance ratio of 70% for example, annealing may be performed at approximately 250° C., or in order to obtain a magnetoresistance ratio of 100%, annealing may be performed at 300° C. In so doing, assuming the annealing temperature is 300° C., FIG. 2 indicates that, in order to obtain a magnetoresistive element having a magnetization direction that is perpendicular to the film surface, the thicknesses of the first ferromagnetic layer 106 and the second ferromagnetic layer 107 may be controlled to be approximately 1.0 nm to 1.6 nm.

Figure 4:
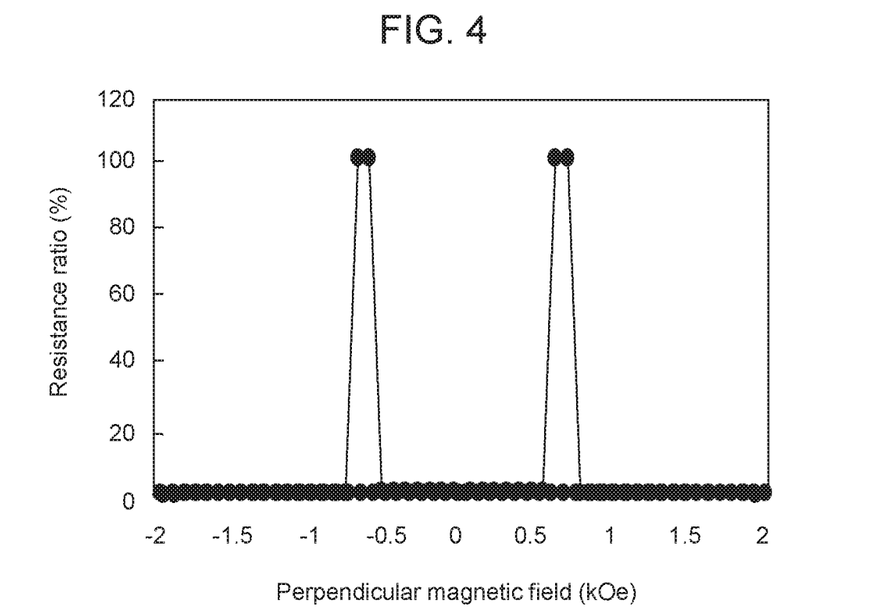
FIG. 4 is a diagram showing changes in the resistance of a magnetoresistive element with respect to a magnetic field applied perpendicularly to the film surface for a case where CoFeB is used for a first ferromagnetic layer and a second ferromagnetic layer.

Even in cases where other materials are used, by examining the relationship between annealing temperature and magnetoresistance ratio in advance, it is possible to fabricate a magnetoresistive element with which the desired magnetoresistance ratio is achieved and in which the magnetization direction is perpendicular to the film surface. FIG. 4 shows the change in resistance of a magnetoresistive element with respect to a magnetic field applied perpendicularly to the film surface with regard to a case where CoFeB is used as the material of the first ferromagnetic layer 106 and the second ferromagnetic layer 107, and MgO for the non-magnetic layer 108. In this example, the annealing temperature was 300° C. From the experiment results, it can be seen that the magnetization direction is perpendicular to the film surface. In addition, the magnetoresistance ratio in this case was 100%.

By employing the present invention, a magnetoresistive element with a large magnetoresistance ratio and whose magnetization direction is perpendicular to the film surface may be fabricated with ease. In addition, if one wishes to control the magnetoresistance ratio, by controlling the annealing temperature while adjusting the thicknesses of a first ferromagnetic layer and a second ferromagnetic layer so formed as to sandwich a non-magnetic layer, a magnetoresistive element that maintains a magnetization direction perpendicular to the film surface may be fabricated.

DETAILED DESCRIPTION OF THE INVENTION

Magnetic memory and magnetoresistive elements to which the present invention is applied are described in detail below with reference to the drawings.

Exemplary Embodiment 1

Figure 5:
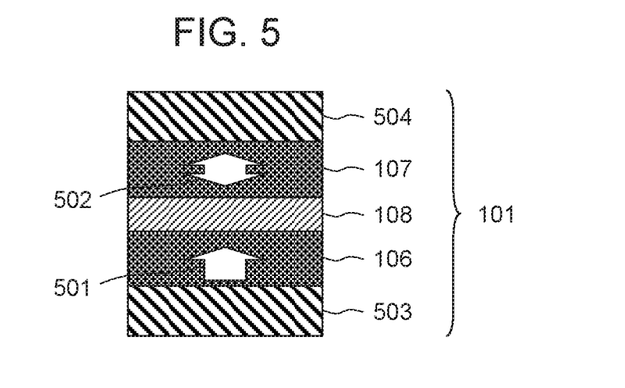
FIG. 5 is a schematic sectional view showing an example of a magnetoresistive element according to the present invention.

According to an aspect of the present invention, the magnetoresistive element 101 comprises, as shown in FIG. 5, the first ferromagnetic layer 106 with a fixed magnetization direction, the second ferromagnetic layer 107 with a variable magnetization direction, and the non-magnetic layer 108 electrically connected between the first ferromagnetic layer and the second ferromagnetic layer. For the material of the first ferromagnetic layer 106 and the second ferromagnetic layer 107, a ferromagnetic material containing at least one type of 3d transition metal element, e.g., Co, Fe, etc., or a Heusler alloy, chief examples of which include $Co_2MnSi$, etc., is preferable. For the material of the non-magnetic layer 108, compounds containing oxygen, e.g., MgO, $Al_2O_3$, $SiO_2$, etc., and metals, e.g., Cu, etc., are candidates, where a material that results in a large magnetoresistance ratio is preferable. For Exemplary Embodiment 1, a description is provided taking as an example a case where the material of the first ferromagnetic layer 106 and the second ferromagnetic layer 107 is CoFeB, and the non-magnetic layer 108 comprises MgO.

As shown in FIG. 2, by controlling the thicknesses of the first ferromagnetic layer 106 and the second ferromagnetic layer 107 to be approximately 1.0 nm to 1.6 nm, magnetization 501 of the first ferromagnetic layer 106 and magnetization 502 of the second ferromagnetic layer 107 become perpendicular to the film surface when the annealing temperature is 300° C. As shown in FIG. 3, in this case, a magnetoresistance ratio of 100% or above is achieved. In Exemplary Embodiment 1 in FIG. 5, by providing a difference in thickness between the first ferromagnetic layer 106 and the second ferromagnetic layer 107 within a range where the magnetization directions are perpendicular to the film surface, a difference in coercivity was created, the first ferromagnetic layer 106 was made to be a reference layer, and the second ferromagnetic layer 107 was made to be a recording layer. As an example, the first ferromagnetic layer 106 was made to be 1.0 nm in thickness, and the second ferromagnetic layer 107 was made to be 1.2 nm in thickness. In the case of this Exemplary Embodiment, the thinner ferromagnetic layer 106 functioned as a reference layer. Naturally, the thicknesses may also be so adjusted as to have the first ferromagnetic layer 106 be a recording layer, and the second ferromagnetic layer 107 a reference layer.

In addition, although the magnetization direction of the first ferromagnetic layer 106, which is the reference layer, is upward in Exemplary Embodiment 1 in FIG. 5, it may also be fixed downward. In addition, at least one of the first ferromagnetic layer 106 and the second ferromagnetic layer 107 may be formed with a ferromagnetic body whose magnetization direction changes from being parallel to the film surface to being perpendicular by controlling the annealing temperature and the thickness, and the other with a multi-layer film, e.g., Co and Pt, Ni and Pt, etc., or with some other conventionally known perpendicular magnetic anisotropy material, e.g., FePt and TbTeCo alloys, etc.

Figure 6:
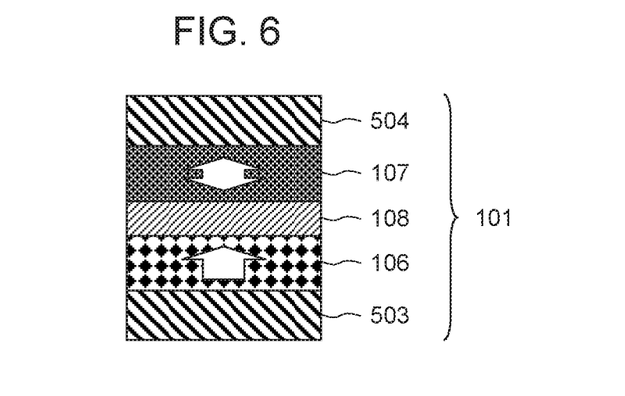
FIG. 6 is a schematic sectional view showing an example of a magnetoresistive element according to the present invention.

FIG. 6 shows an example of a case where FePt, which is a conventionally known perpendicular anisotropy material, was used for the first ferromagnetic layer 106 to make it a reference layer, and CoFeB was used for the second ferromagnetic layer 107. In this case, since the materials differ between the recording layer and the reference layer, a coercivity difference may be created with ease. With respect to the annealing temperature in this case, the resistance ratio of a magnetoresistive element in which CoFeB is used may be taken into consideration By way of example, to obtain a resistance ratio of 100%, it may be made to be 300° C. Further, in the case of CoFeB, if annealing is to be performed at 300° C., the magnetization direction may be made perpendicular to the film surface by having the thickness be 1.0 nm to 1.6 nm. In addition, a further layer made of a ferromagnetic body containing at least one type of 3d transition metal, e.g., Co, Fe, etc., or a Heusler alloy may also be inserted between the first ferromagnetic layer 106 and the non-magnetic layer 108.

The magnetoresistive element 101 may also be of a structure comprising an underlayer 503 and a capping layer 504. Since the underlayer 503 is a layer that serves as a foundation for fabricating the magnetoresistive element 101, its surface roughness must be of a small value. By way of example, Ta and Ru may be used. It may also be of a multi-layer structure, e.g., Ta/Ru/Ta, etc. In addition, the underlayer may also be made to function as an orientation control layer. In particular, when a conventionally known perpendicular anisotropy material, e.g., FePt, etc., discussed above, is used for the first ferromagnetic layer 106, there is a strong need for orientation control. The capping layer 504 also serves the purpose of protecting the magnetoresistive element, and, by way of example, MgO, Ru, Ta, etc., may be used. The capping layer 504, too, may be of a multi-layer structure, e.g., Ta/Ru, etc.

Exemplary Embodiment 2

Figure 7:
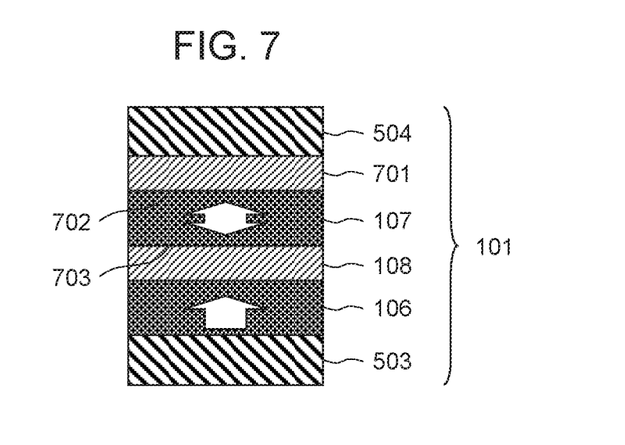
FIG. 7 is a schematic sectional view showing an example of a magnetoresistive element according to the present invention.

According to another aspect of the present invention, a magnetoresistive element may also be of a structure where a second non-magnetic layer 701 is formed at an interface 702 of the second ferromagnetic layer 107, which acts as a recording layer, on the opposite side to the non-magnetic layer 108. A schematic sectional view of a magnetoresistive element of Exemplary Embodiment 2 is shown in FIG. 7.

With the magnetoresistive element of Exemplary Embodiment 1, the interface effect for causing the magnetization of the second ferromagnetic layer 107 to be perpendicular to the film surface occurred only at an interface 703 between the second ferromagnetic layer 107 and the non-magnetic layer 108. With the magnetoresistive element 101 of Exemplary Embodiment 2, however, the interface effect also occurs at the interface 702 between the second ferromagnetic layer 107 and the second non-magnetic layer 701. Thus, as compared to the magnetoresistive element of Exemplary Embodiment 1, with the magnetoresistive element of Exemplary Embodiment 2, the magnetization direction of the second ferromagnetic layer 107 becomes more firmly perpendicular to the film surface, thereby enabling an increase in thermal stability factor. In so doing, the thickness of the second ferromagnetic layer 107 is so controlled that the magnetization would be perpendicular to the film surface and as to maximize the interface effect, and it may in some cases differ from the thickness of the second ferromagnetic layer 107 with respect to the configuration of Exemplary Embodiment 1. In the example in FIG. 7, CoFeB was used for the first ferromagnetic layer 106 and the second ferromagnetic layer 107, and MgO was used for the non-magnetic layer 108 and the non-magnetic layer 701. An annealing temperature of 300° C. in this case resulted in a resistance ratio exceeding 100%. In addition, in this example, by making the thickness of the second ferromagnetic layer 107 be 1.2 nm, the magnetization direction became perpendicular to the film surface. Candidates for the material of the second non-magnetic layer 701 include compounds containing oxygen, e.g., MgO, $Al_2O_3$, $SiO_2$, etc., and metals such as Cu, etc. It is preferable that a material that results in a greater interface effect for causing the magnetization direction of the second ferromagnetic layer 107 to be perpendicular be selected.

Exemplary Embodiment 3

Figure 8:
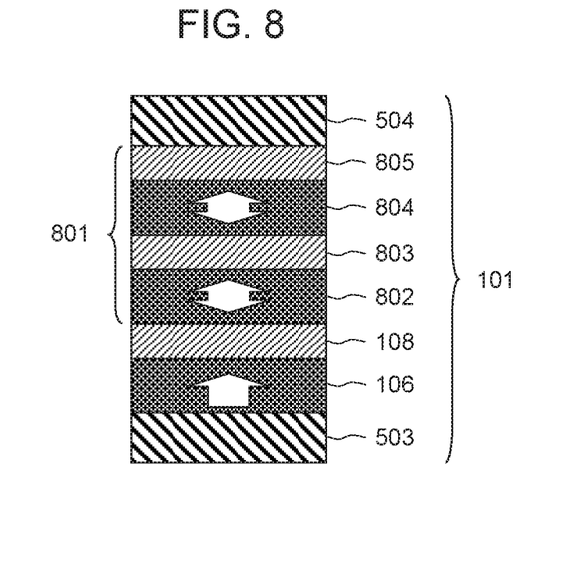
FIG. 8 is a schematic sectional view showing an example of a magnetoresistive element according to the present invention.

According to a further aspect of the present invention, a recording layer of a magnetoresistive element may be of a structure where, from the surface in contact with the non-magnetic layer 108, ferromagnetic layers and non-magnetic layers are alternately laminated. FIG. 8 shows, by way of example, a schematic sectional view for a case where, as the recording layer, four layers are laminated, as in ferromagnetic layer/non-magnetic layer/ferromagnetic layer/non-magnetic layer. Here, for a magnetoresistive element of Exemplary Embodiment 3, the recording layer may be of a laminate structure comprising three or more layers.

By adopting such a structure, because the number of interfaces between a ferromagnetic layer and a non-magnetic layer increases, there occurs a greater interface effect for causing the magnetization direction of a recording layer 801 to be perpendicular, thereby enabling an increase in thermal stability factor as compared to the magnetoresistive element of Exemplary Embodiment 2. In addition, the fact that the total volume of the ferromagnetic layer parts forming the recording layer 801 increases also contributes to the increase in thermal stability factor. For the material of the ferromagnetic layers forming the recording layer 801, a ferromagnetic material containing at least one type of 3d transition metal element, e.g., Co, Fe, etc., or a Heusler alloy is preferable. For the material of the non-magnetic layers forming the recording layer 801, candidates include compounds containing oxygen, e.g., MgO, $Al_2O_3$, $SiO_2$, etc., and metals, e.g., Cu, etc. It is preferable that materials that result in a greater interface effect for causing the magnetization direction of the recording layer 801 to be perpendicular be selected. In addition, control is necessary so that the magnetization of the ferromagnetic layers forming the recording layer 801 would be perpendicular to the film surface and so as to maximize the interface effect. There may be cases where the thickness would be different from that of the second ferromagnetic layer 107 with respect to the configuration of Exemplary Embodiment 1 or Exemplary Embodiment 2.

In the example shown in FIG. 8, the material of ferromagnetic layers 802 and 804 forming the recording layer 801 was CoFeB, and the material of non-magnetic layers 803 and 805 forming the recording layer 801 was MgO. In this example, an annealing temperature of 300° C. resulted in a resistance ratio of 100%. In addition, by having the ferromagnetic layers 802 and 804 forming the recording layer 801 in this case each be 1.2 nm in thickness, the magnetization direction became perpendicular to the film surface. Further, the magnetizations of the ferromagnetic layer 802 and the ferromagnetic layer 804 forming the recording layer 801 may be arranged to be mutually parallel or anti-parallel, and this arrangement is controlled by varying the thickness of the non-magnetic layer 803 between the two. In addition, the material of the non-magnetic layer 803 forming the recording layer 801 may also be a non-magnetic body containing at least one type of element from among such elements as Ru, Rh, V, etc. In this case, because exchange coupling occurs between the ferromagnetic layer 802 and the ferromagnetic layer 804, by controlling the thickness of the non-magnetic layer 803, the magnetization directions of the ferromagnetic layer 802 and the ferromagnetic layer 804 may be changed to be parallel or anti-parallel with ease.

Exemplary Embodiment 4

According to another aspect of the present invention, a magnetoresistive element may also be of a structure where a third non-magnetic layer 901 is formed at an interface 903 of the first ferromagnetic layer 106, which acts as a reference layer, on the opposite side to the non-magnetic layer 108. A schematic sectional view of a magnetoresistive element of Exemplary Embodiment 4 is shown in FIG. 9.

With the magnetoresistive element of Exemplary Embodiment 1, the interface effect for causing the magnetization of the first ferromagnetic layer 106 to be perpendicular to the film surface occurred only at an interface 902 between the first ferromagnetic layer 106 and the non-magnetic layer 108. With the magnetoresistive element of Exemplary Embodiment 4, however, the interface effect also occurs at the interface 903 between the first ferromagnetic layer 106 and the third non-magnetic layer 901. Thus, as compared to the magnetoresistive element of Exemplary Embodiment 1, with the magnetoresistive element of Exemplary Embodiment 4, the magnetization direction of the first ferromagnetic layer 106 becomes more firmly perpendicular to the surface, thereby enabling an increase in thermal stability factor. In so doing the thickness of the first ferromagnetic layer 106 is so controlled that the magnetization would be perpendicular to the film surface and as to maximize the interface effect, and it may in some cases differ from the thickness of the first ferromagnetic layer 106 with respect to the configuration of Exemplary Embodiment 1.

Figure 9:
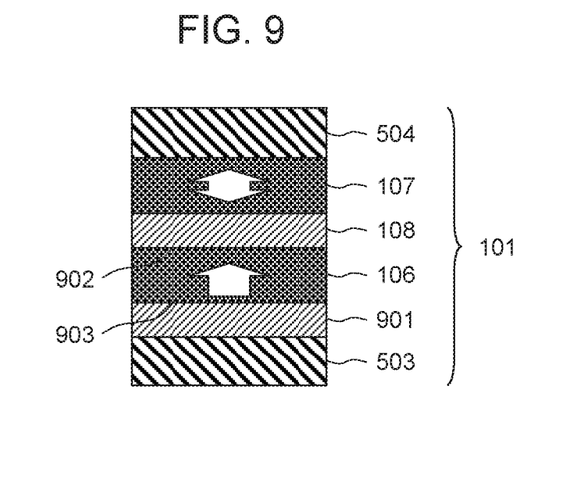
FIG. 9 is a schematic sectional view showing an example of a magnetoresistive element according to the present invention.

As an example of the structure in FIG. 9, CoFeB was used for the first ferromagnetic layer 106 and the second ferromagnetic layer 107, and MgO was used for the non-magnetic layer 108 and the non-magnetic layer 901. An annealing temperature of 300° C. resulted in a resistance ratio exceeding 100%. In addition, in this example, by having the first ferromagnetic layer 106 be 1.0 nm in thickness, the magnetization direction became perpendicular to the film surface. Candidates for the material of the third non-magnetic layer 901 include compounds containing oxygen, e.g., MgO, $Al_2O_3$, $SiO_2$, etc., and metals such as Cu, etc. It is preferable that a material that results in a greater interface effect for causing the magnetization direction of the first ferromagnetic layer 106 to be perpendicular be selected.

Exemplary Embodiment 5

Figure 10:
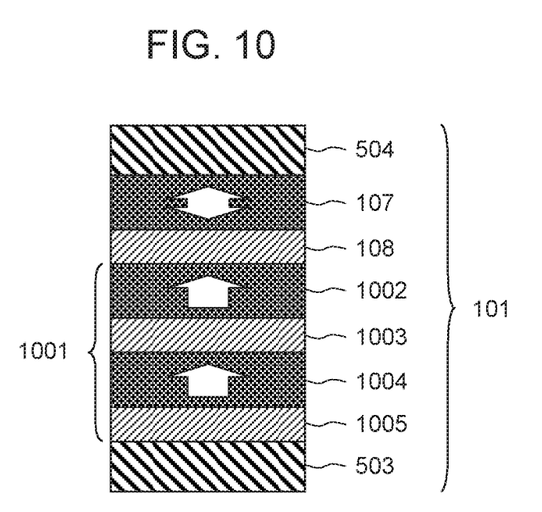
FIG. 10 is a schematic sectional view showing an example of a magnetoresistive element according to the present invention.

According to another aspect of the present invention, a reference layer 1001 of a magnetoresistive element may be of a structure where, from the surface in contact with the non-magnetic layer 108, ferromagnetic layers and non-magnetic layers are alternately laminated. FIG. 10 shows, by way of example, a sectional view for a case where, as the reference layer 1001, four layers are laminated, as in ferromagnetic layer/non-magnetic layer/ferromagnetic layer/non-magnetic layer. Here, for a magnetoresistive element of Exemplary Embodiment 5, the reference layer may be of a laminate structure comprising three or more layers.

By adopting such a structure, because the number of interfaces between a ferromagnetic layer and a non-magnetic layer increases, there occurs a greater interface effect for causing the magnetization direction of the reference layer 1001 to be perpendicular, and the total volume of the ferromagnetic layer parts forming the reference layer 1001 increases, as a result of which the magnetization direction stabilizes in the perpendicular direction to the film surface. For the material of ferromagnetic layers 1002 and 1004 forming the reference layer 1001, a ferromagnetic material containing at least one type of 3d transition metal element, e.g., Co, Fe, etc., or a Heusler alloy is preferable. For the material of non-magnetic layers 1003 and 1005 forming the reference layer 1001, candidates include compounds containing oxygen, e.g., MgO, $Al_2O_3$, $SiO_2$, etc., and metals, e.g., Cu, etc. It is preferable that materials that result in a greater interface effect for causing the magnetization direction of the reference layer 1001 to be perpendicular be selected. In addition, control is necessary so that the magnetization of the ferromagnetic layers forming the reference layer 1001 would be perpendicular to the film surface and so as to maximize the interface effect. There may be cases where the thickness would be different from that of the first ferromagnetic layer 106 with respect to the configuration of Exemplary Embodiment 1 or Exemplary Embodiment 4.

In the example of the configuration shown in FIG. 10, the material of the ferromagnetic layers 1002 and 1004 forming the reference layer 1001 was CoFeB, and the material of the non-magnetic layers 1003 and 1005 forming the reference layer 1001 was MgO. In this example, an annealing temperature of 300° C. resulted in a resistance ratio of 100%. In addition, by having the ferromagnetic layers 1002 and 1004 forming the reference layer 1001 in this case each be 1.0 nm in thickness, the magnetization direction became perpendicular to the film surface. Further, the magnetizations of the ferromagnetic layer 1002 and the ferromagnetic layer 1004 forming the reference layer 1001 may be arranged to be mutually parallel or anti-parallel, and this arrangement is controlled by varying the thickness of the non-magnetic layer 1003 between the two. In addition, the material of the non-magnetic layer 1003 forming the reference layer 1001 may also be a non-magnetic body containing at least one type of element from among such elements as Ru, Rh, V, etc. In this case, because exchange coupling occurs between the magnetizations of the ferromagnetic layer 1002 and the ferromagnetic layer 1004, by controlling the thickness of the non-magnetic layer 1003, the magnetization directions of the ferromagnetic layer 1002 and the ferromagnetic layer 1004 may be changed to be parallel or anti-parallel with ease.

Exemplary Embodiment 6

Figure 11:
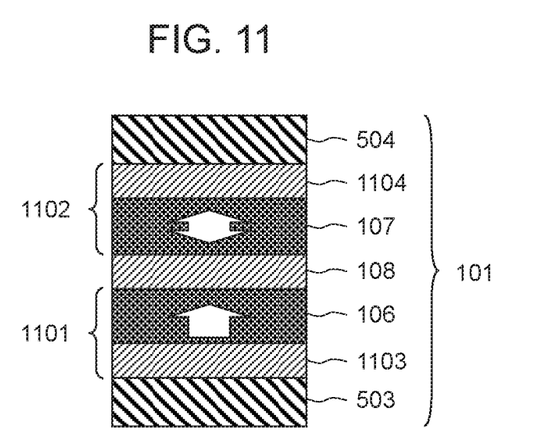
FIG. 11 is a schematic sectional view showing an example of a magnetoresistive element according to the present invention.

According to another aspect of the present invention, a magnetoresistive element may also be of a structure comprising a non-magnetic layer 1103 and a non-magnetic layer 1104, the non-magnetic layer 1103 being formed for a reference layer 1101 at an interface of the first ferromagnetic layer 106 on the opposite side to the non-magnetic layer 108, and the non-magnetic layer 1104 being formed for a recording layer 1102 at an interface of the second ferromagnetic layer 107 on the opposite side to the non-magnetic layer 108. A schematic sectional view of a magnetoresistive element of Exemplary Embodiment 6 is shown in FIG. 11. By adopting such a configuration, both the reference layer and the recording layer stabilize in the perpendicular direction to the film surface.

Exemplary Embodiment 7

Figure 12:
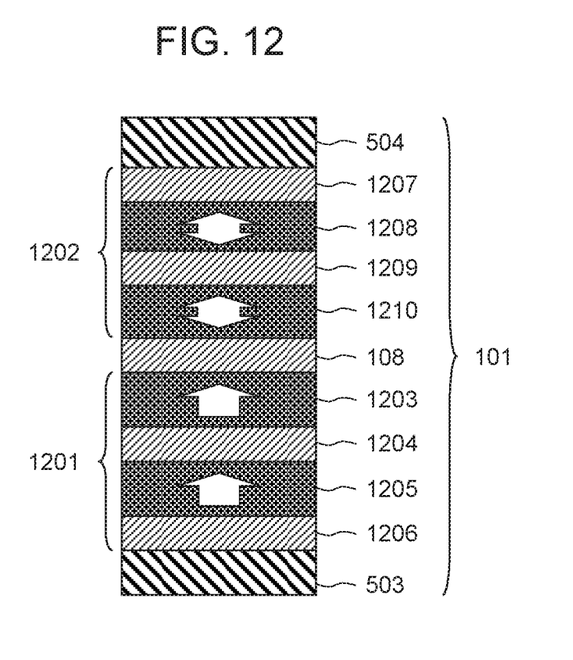
FIG. 12 is a schematic sectional view showing an example of a magnetoresistive element according to the present invention.

According to another aspect of the present invention, a magnetoresistive element may also be of a configuration comprising: as a reference layer 1201, a structure where, from the surface in contact with the non-magnetic layer 108, ferromagnetic layers and non-magnetic layers are alternately laminated; and, as a recording layer 1202, a structure where, from the surface in contact with the non-magnetic layer 108, ferromagnetic layers and non-magnetic layers are alternately laminated. FIG. 12 shows, by way of example, a schematic sectional view for a case where, as the reference layer 1201, four layers are laminated, as in ferromagnetic layer 1203/non-magnetic layer 1204/ferromagnetic layer 1205/non-magnetic layer 1206 in order from the side of the non-magnetic layer 108, and where, as the recording layer 1202, four layers are laminated, as in ferromagnetic layer 1210/non-magnetic layer 1209/ferromagnetic layer 1208/non-magnetic layer 1207 in order from the side of the non-magnetic layer 108. By adopting such a configuration, both the reference layer and the recording layer stabilize in the perpendicular direction to the film surface.

Exemplary Embodiment 8

Figure 13:
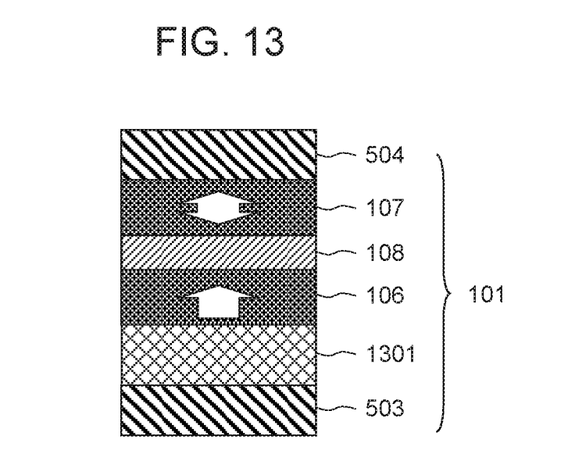
FIG. 13 is a schematic sectional view showing an example of a magnetoresistive element according to the present invention.

According to another aspect of the present invention, with respect a magnetoresistive element, the configuration may also be one in which an antiferromagnetic layer 1301 is formed at an interface of the reference layer 106 on the opposite side to the non-magnetic layer 108 as shown in the schematic sectional view in FIG. 13. By adopting such a configuration, the magnetization direction of the reference layer 106 stabilizes in the perpendicular direction to the film surface.

Exemplary Embodiment 9

Figure 14:
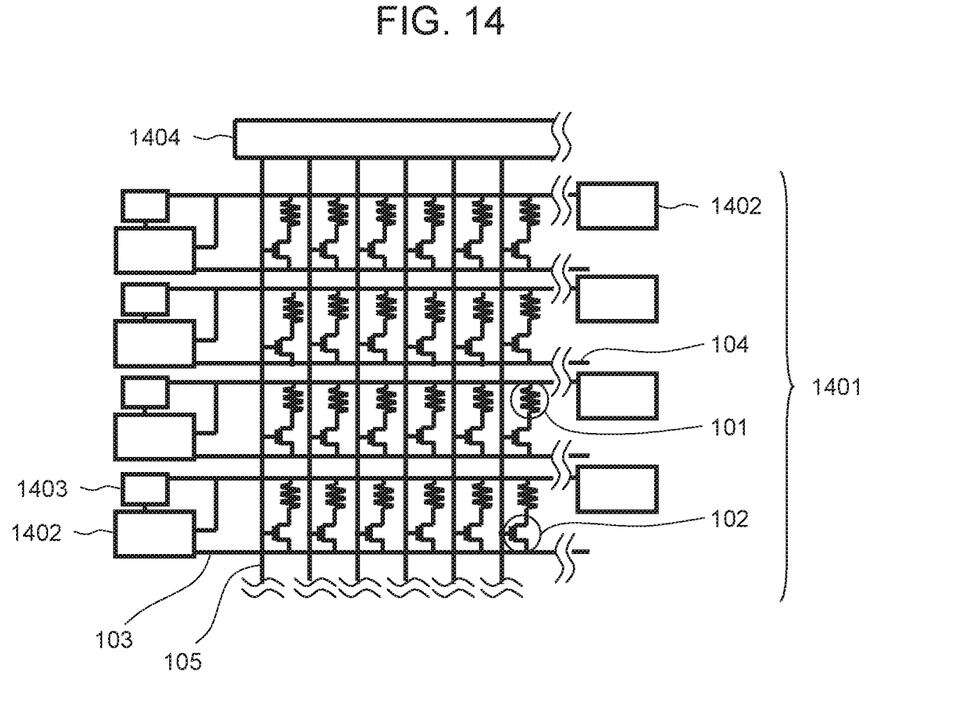
FIG. 14 is a conceptual diagram showing an example of magnetic memory according to the present invention.

According to another aspect of the present invention, it is possible to realize a MRAM by employing the magnetoresistive elements of Exemplary Embodiments 1-8 as recording elements. A MRAM of the present invention comprises, as shown in FIG. 14: a plurality of bit lines 104 disposed parallel to one another; a plurality of source lines 103 disposed parallel to the bit lines 104 as well as to one another; and a plurality of word lines 105 disposed perpendicularly to the bit lines 104 and parallel to one another. A memory cell 100 is disposed at each point of intersection between the bit lines 104 and the word lines 105. The memory cells 100 each comprise the magnetoresistive element 101 of Exemplary Embodiments 1-8 and a select transistor 102. The plurality of memory cells 100 form a memory array 1401. The bit line 104 is electrically connected with the drain electrode of the select transistor 102 via the magnetoresistive element 101. The source line 103 is electrically connected with the source electrode of the select transistor 102 via a wire layer. In addition, the word line 105 is electrically connected with the gate electrode of the select transistor 102. One end of the source line 103 and the bit line 104 is electrically connected with a write driver 1402 and a sense amplifier 1403 for applying a voltage. One end of the word line 105 is electrically connected with a word driver 1404.

In a "0" write operation, a current is passed through the source line 103 from the bit line 104 via the magnetoresistive element 101 by applying a voltage across the bit line 104 from the write driver 1402, while also applying a voltage across the word line 105 from the word driver 1404. In this case, if, as in FIG. 6, the configuration of the magnetoresistive element 101 is such that the first ferromagnetic layer 106 is the reference layer and the second ferromagnetic layer 107 is the recording layer, the magnetoresistive element 101 becomes low in resistance, and the information held by the magnetoresistive element 101 becomes "0". On the other hand, in a "1" write operation, a current is passed through the bit line 104 from the source line 103 via the magnetoresistive element 101 by applying a voltage across the source line 103 from the write driver 1402, while also applying a voltage across the word line 105 from the word driver 1404. In this case, the magnetoresistive element 101 becomes high in resistance, and the information held by the magnetoresistive element 101 becomes "1". When reading differences in the signal caused by changes in resistance are read using the sense amplifier 1403. By adopting a memory array of such a configuration, the magnetoresistance ratio increases, the switching current density decreases, and the thermal stability factor increases. Thus, the MRAM is able to operate as a non-volatile memory.

EXPLANATIONS OF LETTERS OR NUMERALS

100 Memory cell of magnetic memory
101 Magnetoresistive element
102 Select transistor
103 Source line
104 Bit line
105 Word line
106 First ferromagnetic layer
107 Second ferromagnetic layer
108 Non-magnetic layer
501 Magnetization
502 Magnetization
503 Underlayer
504 Capping layer
701 Second non-magnetic layer
801 Recording layer
802 Ferromagnetic layer
803 Non-magnetic layer
804 Ferromagnetic layer
805 Non-magnetic layer
901 Non-magnetic layer
1001 Reference layer
1002 Ferromagnetic layer
1003 Non-magnetic layer
1004 Ferromagnetic layer
1005 Non-magnetic layer
1101 Reference layer
1102 Recording layer
1103 Non-magnetic layer
1104 Non-magnetic layer
1201 Reference layer
1202 Recording layer
1203 Ferromagnetic layer
1204 Non-magnetic layer
1205 Ferromagnetic layer
1206 Non-magnetic layer
1207 Non-magnetic layer
1208 Ferromagnetic layer
1209 Non-magnetic layer
1210 Ferromagnetic layer
1301 Antiferromagnetic layer
1401 Memory array
1402 Write driver
1403 Sense amplifier
1404 Word driver

What is claimed is:

1. A magnetoresistive element, comprising:
   a non-magnetic layer that contains oxygen;
   a reference layer having a fixed magnetization direction and including a ferromagnetic material, the reference layer being disposed directly on one side of the non-magnetic layer; and
   a recording layer having a variable magnetization direction and including a ferromagnetic material, the recording layer being disposed directly on another side of the non-magnetic layer opposite to the one side, wherein
   the ferromagnetic material of at least one of the reference layer and the recording layer contains Fe or Co,
   the reference layer, the recording layer and the non-magnetic layer are arranged so that at least one of the fixed magnetization direction of the reference layer and the variable magnetization direction of the recording layer is caused to become perpendicular to a layer surface by an interfacial perpendicular magnetic anisotropy at an interface between the at least one of the reference layer and the recording layer and the non-magnetic layer, the interfacial perpendicular magnetic anisotropy resulting from the ferromagnetic material of the at least one of the reference layer and the recording layer having a predetermined thickness that is greater than 1 nm, and
   the at least one of the reference layer and the recording layer is a bcc structure, a thickness of which is greater than 1 nm.

2. The magnetoresistive element according to claim 1, wherein the predetermined thickness of the ferromagnetic material of the at least one of the reference layer and the recording layer is equal to or less than 3 nm.

3. The magnetoresistive element according to claim 1, wherein the predetermined thickness of the ferromagnetic material of the at least one of the reference layer and the recording layer is equal to or less than 1.6 nm.

4. The magnetoresistive element according to claim 1, wherein the at least one of the reference layer and the recording layer is the recording layer, the recording layer containing B.

5. The magnetoresistive element according to claim 1, wherein the non-magnetic layer contains Mg.

6. The magnetoresistive element according to claim 1, wherein the at least one of the reference layer and the recording layer has a laminated structure including a plurality of laminated alternating ferromagnetic and non-magnetic layers, and in order from a surface in contact with the non-magnetic layer, one of an uppermost layer of the reference layer and a lowermost layer of the recording layer in the laminated structure, or one of an uppermost layer of the recording layer and a lowermost layer of the reference layer in the laminated structure, is ferromagnetic.

7. The magnetoresistive element according to claim 1, wherein the interface of the non-magnetic layer includes an effective interface between the non-magnetic layer and said one of the reference layer and the recording layer, and the interfacial perpendicular magnetic anisotropy at said effective interface is by itself sufficient to cause the magnetization direction of the one of the reference layer and the recording layer to become perpendicular.

8. A magnetic memory comprising the magnetoresistive element according to claim 1.

9. A magnetoresistive element comprising:
a reference layer having a fixed magnetization direction and including a ferromagnetic material containing at least one type of 3d transition metal;
one non-magnetic layer that is formed directly on one surface of the reference layer and that contains oxygen;
a recording layer that is formed directly on one surface of the one non-magnetic layer, which is opposite to another surface on which the reference layer is formed, the recording layer having a variable magnetization direction, and including a ferromagnetic material containing Fe or Co, the recording layer is a bcc structure, a thickness of which is greater than 1 nm; and
another non-magnetic layer that is formed directly on one surface of the recording layer, which is opposite to another surface on which the one non-magnetic layer is formed, so that the recording layer is formed between the one and the other non-magnetic layers and the one and the other non-magnetic layers are both external to the recording layer, the other non-magnetic layer contains oxygen, wherein
the recording layer, and the one and the other non-magnetic layers are arranged so that the variable magnetization direction of the recording layer is caused to become perpendicular to a layer surface of the recording layer by an interfacial perpendicular magnetic anisotropy at interfaces between the recording layer and the one non-magnetic layer, and between the recording layer and the other non-magnetic layer, the interfacial perpendicular magnetic anisotropy resulting from the ferromagnetic material of the recording layer having a predetermined thickness that is greater than 1 nm, and
the other non-magnetic layer stabilizes the perpendicularity of the magnetization direction of the recording layer to the recording layer surface.

10. The magnetoresistive element according to claim 9, wherein the predetermined thickness of the ferromagnetic material of the recording layer is equal to or less than 3 nm.

11. The magnetoresistive element according to claim 9, wherein the recording layer further includes B.

12. The magnetoresistive element according to claim 9, wherein the one and the other non-magnetic layers further include Mg.

13. The magnetoresistive element according to claim 9, wherein the recording layer has a laminated structure including a plurality of laminated alternating ferromagnetic and non-magnetic layers,
uppermost and lowermost layers of the laminated structure are ferromagnetic, and
each ferromagnetic layer of the laminated structure includes a ferromagnetic material containing Fe or Co, and at least one of non-magnetic layers in the laminated structure contains oxygen.

14. A magnetic memory comprising the magnetoresistive element according to claim 9.

15. A magnetoresistive element comprising:
a reference layer having a fixed magnetization direction, and including a ferromagnetic material containing Fe or Co, the reference layer is a bcc structure, a thickness of which is greater than 1 nm;
one non-magnetic layer that is formed directly on one surface of the reference layer and that contains oxygen;
a recording layer that is formed directly on one surface of the one non-magnetic layer, which is opposite to another surface on which the reference layer is formed, the recording layer having a variable magnetization direction and including a ferromagnetic material containing at least one type of 3d transition metal; and
another non-magnetic layer that is formed directly on another surface of the reference layer so that the reference layer is formed between the one and the other non-magnetic layers and the one and the other non-magnetic layers are both external to the reference layer, the other non-magnetic layer containing oxygen, wherein
the reference layer, and the one and the other non-magnetic layers are arranged so that the fixed magnetization direction of the reference layer is caused to become perpendicular to a layer surface of the reference layer by an interfacial perpendicular magnetic anisotropy at interfaces between the reference layer and the one non-magnetic layer, and between the reference layer and the other non-magnetic layer, the interfacial perpendicular magnetic anisotropy resulting from the ferromagnetic material of the reference layer having a predetermined thickness that is greater than 1 nm, and
the other non-magnetic layer stabilizes the perpendicularity of the magnetization direction of the reference layer to the reference layer surface.

16. The magnetoresistive element according to claim 15, wherein the predetermined thickness of the ferromagnetic material of the reference layer is equal to or less than 3 nm.

17. The magnetoresistive element according to claim 15, wherein the reference layer further includes B.

18. The magnetoresistive element according to claim 15, wherein the one and the other non-magnetic layers further include Mg.

19. The magnetoresistive element according to claim 15, wherein the reference layer has a laminated structure including a plurality of laminated alternating ferromagnetic and non-magnetic layers,
uppermost and lowermost layers of the laminated structure are ferromagnetic, and
each ferromagnetic layer of the laminated structure includes a ferromagnetic material containing Fe or Co, and at least one of non-magnetic layers in the laminated structure contains oxygen.

20. A magnetic memory comprising the magnetoresistive element according to claim 15.

* * * * *